United States Patent
Yeh et al.

(10) Patent No.: US 10,163,816 B2
(45) Date of Patent: Dec. 25, 2018

(54) STRUCTURE AND FORMATION METHOD OF CHIP PACKAGE WITH LID

(71) Applicant: Taiwan Semiconductor Manufacturing Co., Ltd., Hsinchu (TW)

(72) Inventors: Shu-Shen Yeh, Taoyuan (TW); Chin-Hua Wang, New Taipei (TW); Kuang-Chun Lee, New Taipei (TW); Po-Yao Lin, Zhudong Township, Hsinchu County (TW); Shyue-Ter Leu, Hsinchu (TW); Shin-Puu Jeng, Po-Shan Village (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/180,404

(22) Filed: Jun. 13, 2016

(65) Prior Publication Data
US 2017/0358542 A1    Dec. 14, 2017

(51) Int. Cl.
| H01L 23/10 | (2006.01) |
|---|---|
| H01L 23/04 | (2006.01) |
| H01L 23/00 | (2006.01) |
| H01L 23/498 | (2006.01) |
| H01L 23/367 | (2006.01) |

(52) U.S. Cl.
CPC .......... *H01L 23/562* (2013.01); *H01L 23/04* (2013.01); *H01L 23/10* (2013.01); *H01L 23/367* (2013.01); *H01L 23/49816* (2013.01); *H01L 23/49838* (2013.01)

(58) Field of Classification Search
CPC ..... H01L 2023/4037; H01L 2023/4056; H01L 2023/4062; H01L 23/373; H01L 23/3736; H01L 25/041; H01L 25/065; H01L 25/07; H01L 23/32; H01L 24/72; H01L 23/12; H01L 23/13; H01L 21/4814; H01L 23/043; H01L 23/3164; H01L 23/36; H01L 21/4871; H01L 21/4882; H01L 23/3733
USPC ....... 257/717, 720, 723, 726, 727, 731, 732, 257/733; 438/121, 122
See application file for complete search history.

(56) References Cited

U.S. PATENT DOCUMENTS

| 6,191,360 | B1 * | 2/2001 | Tao | H01L 23/3128 174/522 |
|---|---|---|---|---|
| 6,376,907 | B1 * | 4/2002 | Takano | H01L 23/04 257/704 |
| 7,211,889 | B2 * | 5/2007 | Shim | H01L 23/10 257/707 |
| 7,271,479 | B2 * | 9/2007 | Zhao | H01L 23/04 257/704 |
| 2004/0251538 | A1 * | 12/2004 | Lin | H01L 23/367 257/712 |
| 2006/0202326 | A1 * | 9/2006 | Huang | H01L 23/3128 257/718 |

* cited by examiner

*Primary Examiner* — Sonya D. McCall-Shepard
(74) *Attorney, Agent, or Firm* — McClure, Qualey & Rodack, LLP

(57) ABSTRACT

Structures and formation methods of a chip package are provided. The chip package includes a substrate and a semiconductor die over a surface of the substrate. The chip package also includes a lid over the semiconductor die. The lid has a number of support structures bonded with the substrate, and the lid has one or more openings between two of the support structures.

20 Claims, 5 Drawing Sheets

STRUCTURE AND FORMATION METHOD OF CHIP PACKAGE WITH LID

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. One smaller type of packaging for semiconductor devices is a chip-scale package (CSP), in which a semiconductor die is placed on a substrate.

New packaging technologies have been developed to further improve the density and functions of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
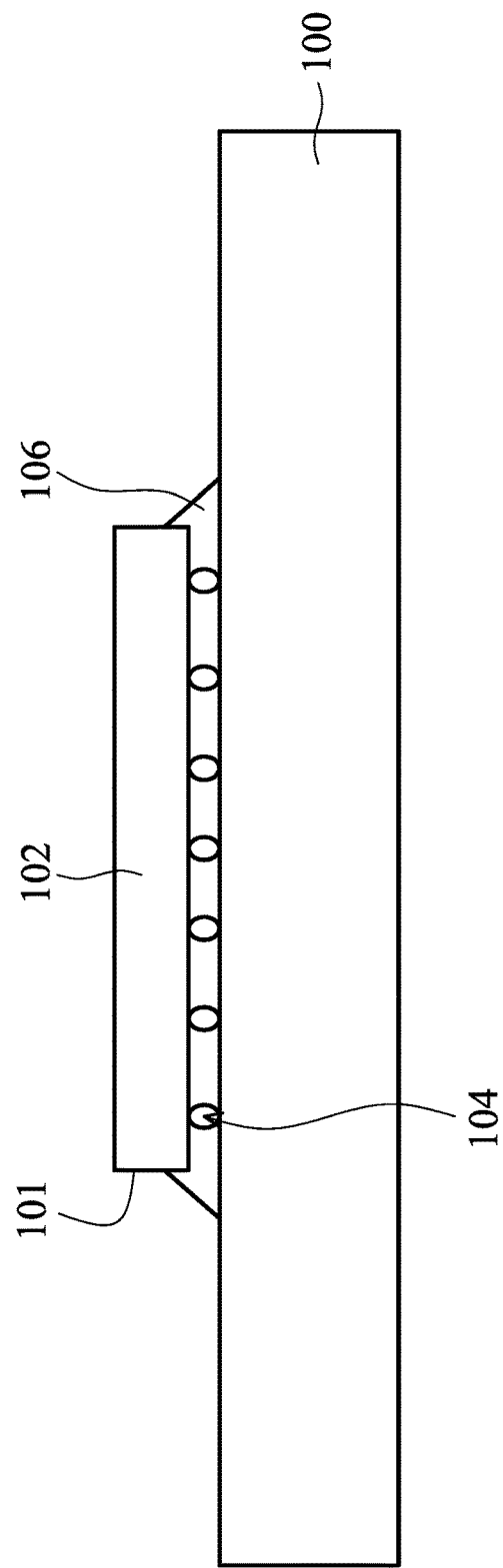
FIGS. 1A-1C are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
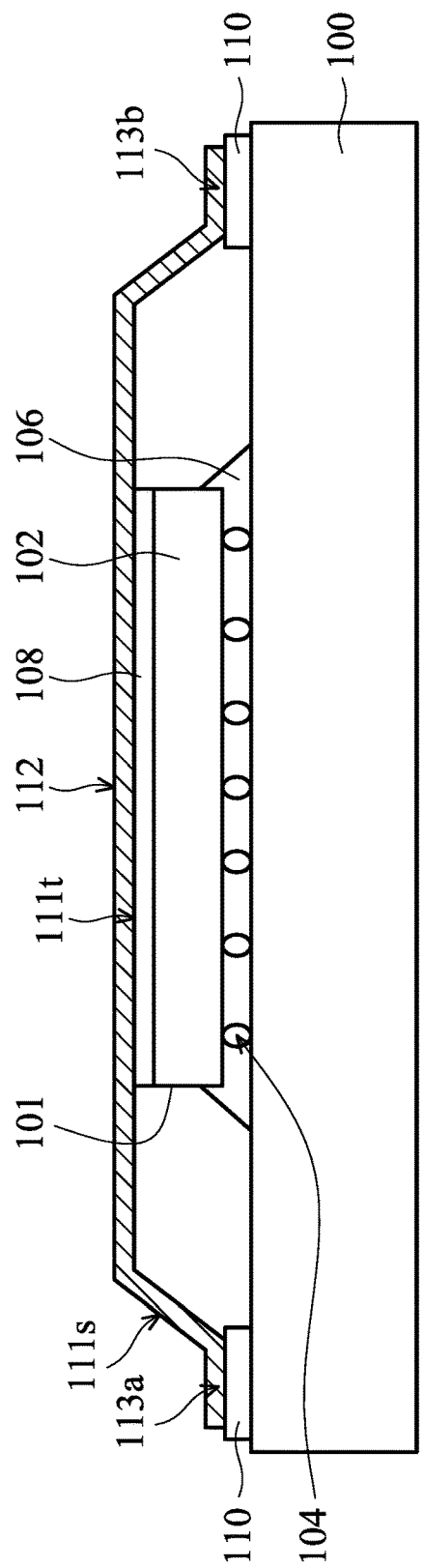
Figure 1C:
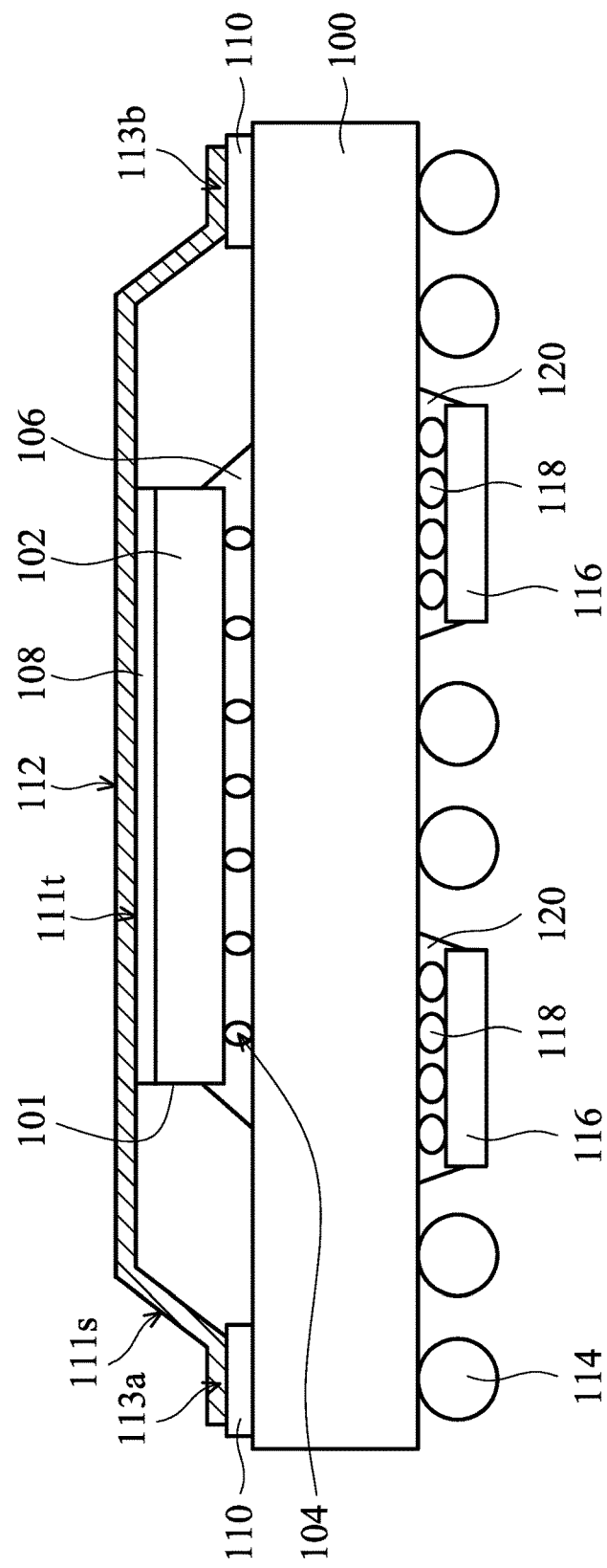
Figure 2:
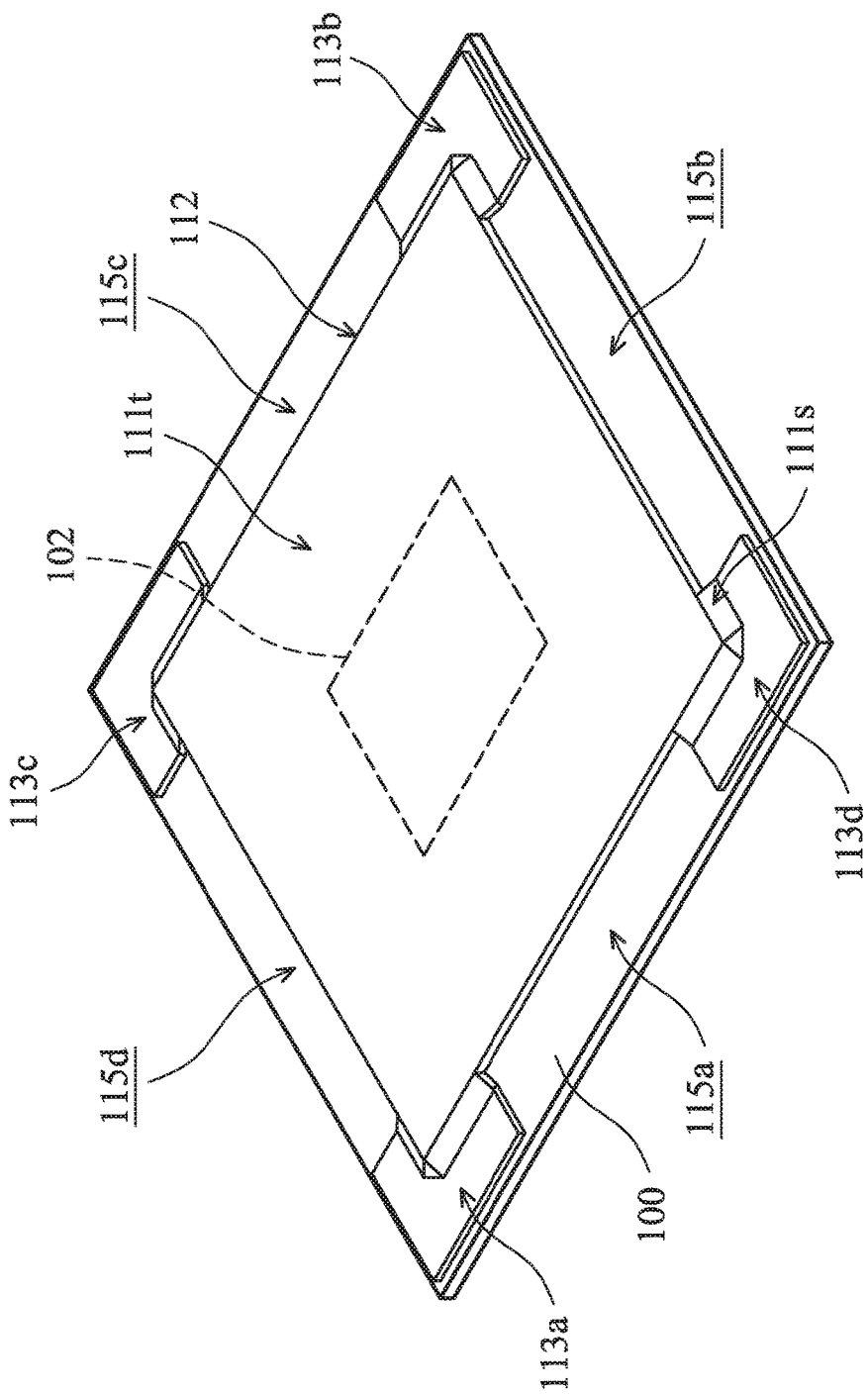
FIG. 2 is a perspective view of a chip package, in accordance with some embodiments.
Figure 3:
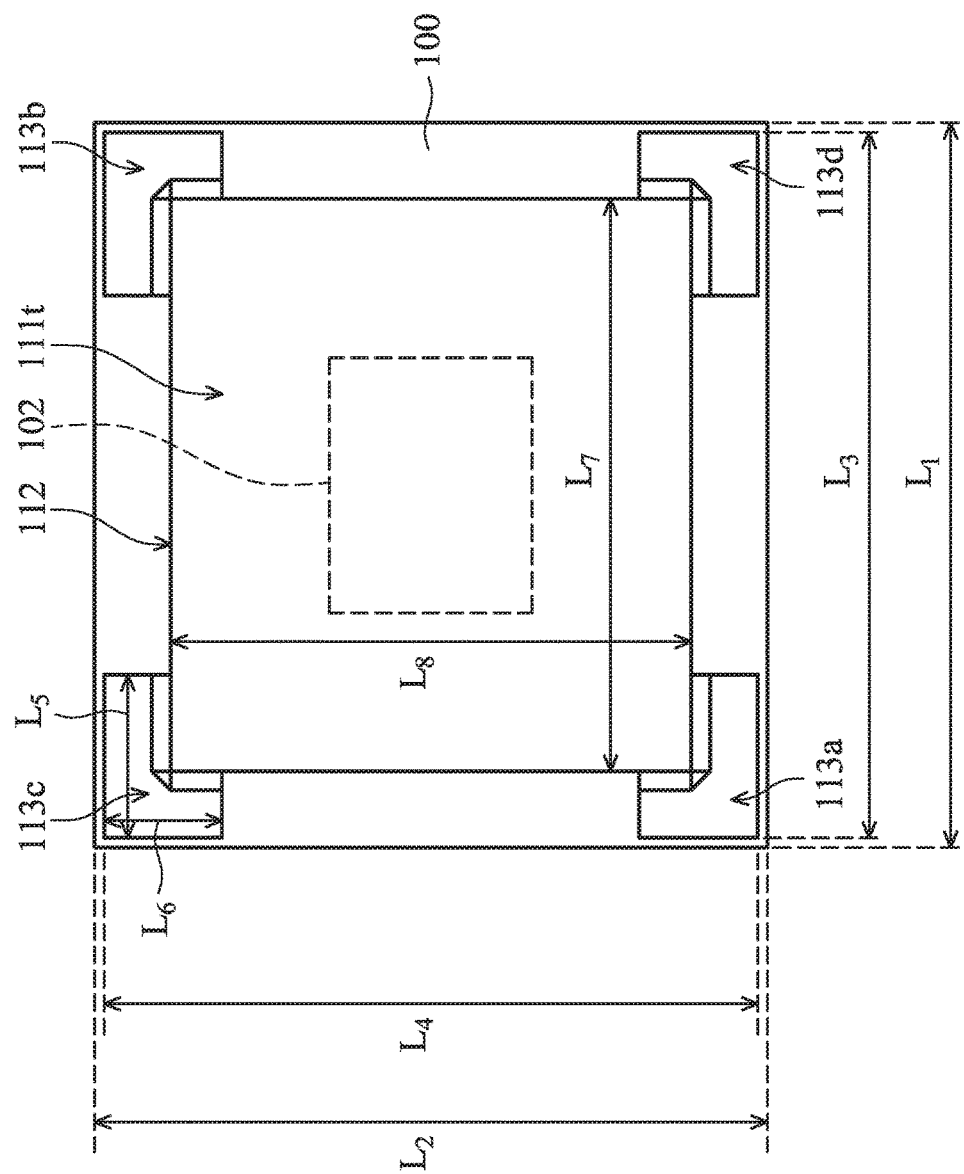
FIG. 3 is a top view of a chip package, in accordance with some embodiments.

FIGS. 1A-1C are cross-sectional views of various stages of a process for forming a chip package, in accordance with some embodiments. FIG. 2 is a perspective view of a chip package, in accordance with some embodiments. In some embodiments, FIG. 2 shows a perspective view of the structure shown in FIG. 1B or FIG. 1C. FIG. 3 is a top view of a chip package, in accordance with some embodiments. In some embodiments, FIG. 3 shows a top view of the structure shown in FIG. 1B, 1C, or 2.

As shown in FIG. 1A, a substrate 100 is received or provided. In some embodiments, the substrate 100 is a circuit board. The substrate 100 may serve as an interposer providing electrical connection routes between elements disposed on opposite surfaces of the substrate 100.

The substrate 100 may include a dielectric material such as an organic material. The organic material may be PP (Polypropylene) with glass fiber, epoxy resin, polyimide, cyanate ester, another suitable material, or a combination thereof. Multiple conductive features (not shown) are formed in the substrate 100.

The conductive features may include conductive lines that provide electrical connections in horizontal directions and/or conductive vias (or plugs) that provide electrical connections in vertical directions. The conductive features may be made of a metal material, such as copper, aluminum, tungsten, titanium, cobalt, gold, platinum, tin, another suitable material, or a combination thereof.

Multiple deposition or coating processes, patterning processes, and planarization processes may be used to form the substrate 100. The deposition or coating processes may include a spin-on process, a chemical vapor deposition (CVD) process, a physical vapor deposition (PVD) process, an electroplating process, an electroless plating process, an atomic layer deposition (ALD) process, a spray coating process, another applicable process, or a combination thereof. The deposition or coating processes may be used to form dielectric layers and conductive layers of the substrate 100.

The patterning processes may include a photolithography process, an etching process, a laser drilling process, a mechanical drilling process, another applicable process, or a combination thereof. The patterning processes may be used to form feature openings that are used to contain the conductive features. For example, the feature openings include trenches and via holes. The trenches may be used to contain conductive lines in the substrate 100, and the via holes may be used to contain conductive vias or conductive plugs of the substrate 100.

The planarization process may include a chemical mechanical polishing (CMP) process, a grinding process, a dry polishing process, an etching process, another applicable process, or a combination thereof. The planarization process may be used to remove excess conductive layers to provide a substantially planar surface, which facilitate to subsequent formation processes.

Many variations and/or modifications can be made to embodiments of the disclosure. In some other embodiments, the substrate 100 is a semiconductor substrate with multiple conductive features formed therein. In some embodiments, the substrate 100 is a semiconductor interposer, such as a silicon interposer.

Afterwards, one or more semiconductor dies (such as a semiconductor die 102) are mounted over the substrate 100, as shown in FIG. 1A in accordance with some embodiments. In some embodiments, various device elements are formed in the semiconductor die 102. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 102 is a system-on-chip (SoC) chip that includes multiple functions.

In some embodiments, multiple conductive elements 104 are formed between the semiconductor die 102 and the substrate 100, as shown in FIG. 1A. The conductive elements 104 form electrical connections between the device elements in the semiconductor die 102 and the conductive features formed in the substrate 100. For example, each of the conductive elements 104 may be in electrical contact with a corresponding pad (not shown) formed on the substrate 100. There may be multiple pads formed on the substrate 100. The pads may be wider portions of the conductive features formed on the substrate or embedded in the substrate 100. Therefore, the device elements in the semiconductor die 102 may be electrically connected to elements that will be formed on the opposite surface of the substrate 100 through the conductive elements 104 and the conductive features in the substrate 100.

In some embodiments, the conductive elements 104 include solder bumps, metal bumps, other suitable structures, or a combination thereof. The conductive elements 104 may include a combination of a solder material and a metal pillar. Each of the conductive elements 104 may include a copper pillar and a solder portion connecting the pads of the substrate 100. For example, a number of copper pillars are formed on conductive pads (not shown) of the semiconductor die 102 through an electroplating process or another applicable process. Afterwards, a solder material is used to bond the copper pillars with the pads of the substrate. A thermal operation may be performed to reflow the solder material. As a result, the conductive elements 104 including the copper pillars and the solder portion are formed.

Many variations and/or modifications can be made to embodiments of the disclosure. In some other embodiments, the conductive elements 104 are not formed. In some embodiments, the semiconductor die 102 is directly bonded on the substrate 100. In some embodiments, the conductive pads of the semiconductor die 102 are in electrical contact with the pads of the substrate 100.

In some embodiments, a protection layer 106 is formed on the substrate 100 to surround the conductive elements 104, as shown in FIG. 1A. The protection layer 106 may be used to prevent the conductive elements 104 from oxidation or being damaged. In some embodiments, an underfill material is disposed or injected between the substrate 100 and the semiconductor die 102 to form the protection layer 106. Embodiments of the disclosure are not limited thereto. In some other embodiments, the protection layer 106 is not formed.

As shown in FIGS. 1B, 2, and 3, a lid 112 is placed over the substrate 100 and the semiconductor die 102, in accordance with some embodiments. The lid 112 may act as a stiffener to prevent the substrate 100 from warping or to reduce the warpage of the substrate 100. The lid may also function as a thermal conductive element. Therefore, not only are the structural strength and reliability of the chip package enhanced, but the dissipation of heat generated during the formation and operation of the chip package is also improved.

In some embodiments, the lid 112 is made of a metal material. The metal material may include copper, aluminum, silver, gold, platinum, steel, another suitable material, or a combination thereof. In some embodiments, the lid 112 is a single-layered structure. For example, the lid is made from an aluminum foil or copper foil. However, embodiments of the disclosure are not limited thereto. In some other embodiments, the lid 112 is a multilayer structure including a number of sub-layers. In some embodiments, the sub-layers are made of the same material. In some other embodiments, some of the sub-layers are made of different materials.

As shown in FIGS. 1B and 2, the lid 112 includes an upper plate 111$t$ and a number of support structures including support structures 113$a$, 113$b$, 113$c$, and 113$d$, in accordance with some embodiments. In some embodiments, the upper plate 111$t$ and the support structures 113$a$-113$d$ have substantially the same thickness. The thickness may be in a range from about 0.15 mm to about 0.25 mm. In some embodiments, each of the support structures 113$a$-113$d$ has a sidewall 111$s$ that connects the upper plate 111$t$. The sidewall 111$s$ may be a slanted sidewall.

In some embodiments, the lid 112 is secured to or bonded with the semiconductor die 102 and the substrate 100, as shown in FIG. 1B. In some embodiments, the upper plate 111$t$ of the lid 112 is secured to the semiconductor die 102 through a thermal interface element 108. In some embodiments, each of the support structures 103$a$-103$d$ of the lid 112 is secured to the semiconductor die 102 through an adhesive element 110. In some embodiments, the thermal interface element 108 is in direct contact with the semiconductor die 102. In some embodiments, the thermal interface element 108 is in direct contact with the semiconductor die 102 and the lid 112.

The thermal interface element 108 may function as a thermal conductor (or heat sink) to dissipate heat from the semiconductor die 102. The thermal interface element 108 may also be used as an adhesive element to bond the lid 112 with the semiconductor die 102. In some embodiments, the adhesive element 110 also functions as a thermal conductor. In some embodiments, materials of the thermal interface element 108 and the adhesive element 110 are the same. However, many variations and/or modifications can be made to embodiments of the disclosure. In some other embodiments, materials of the thermal interface element 108 and the adhesive element 110 are different from each other.

In some embodiments, the upper plate 111$t$ extends beyond edges 101 of the semiconductor die 102, as shown in FIG. 1B. As shown in FIG. 3, the semiconductor die 102 is completely covered by the lid 112 from a top view, in accordance with some embodiments.

As shown in FIG. 2, the lid 112 has one or more openings including openings 115a, 115b, 115c, and 115d, in accordance with some embodiments. In some embodiments, each of the openings 115a-115d is between two of the support structures. As shown in FIG. 2, the opening 115a is between the support structures 113a and 113d. The opening 115b is between the support structures 113b and 113d. The opening 115c is between the support structures 113b and 113c. The opening 115d is between the support structures 113a and 113c.

In some embodiments, the opening 115a extends from the support structure 113a towards the support structure 113d. In some embodiments, the opening 115a extends from the upper plate 111t towards the substrate 100. In some embodiments, the opening 115a extends to the substrate 100. As shown in FIG. 2, edge portions of the substrate 100 (that are between the corner portions) are exposed without connecting the lid 112.

In some embodiments, the opening 115a is surrounded by an edge of the upper plate 111t and edges of the sidewalls 111s of the support structures 113a and 113d, as shown in FIG. 2. In some embodiments, each of the openings 115a-115d penetrates through the lid 112. In some embodiments, each of the openings 115a-115d exposes the substrate 100.

In some embodiments, the lid 112 has four openings, as shown in FIG. 2. In some embodiments, the positions of the openings 115a-115d of the lid 112 are symmetrical with each other, as shown in FIG. 2. However, embodiments of the disclosure are not limited thereto. In some other embodiments, one or some of the openings of the lid 112 are not symmetrical with other openings.

Many variations and/or modifications can be made to embodiments of the disclosure. In some embodiments, the lid 112 has more than four openings. In some other embodiments, the lid 112 has less than four openings.

In some embodiments, shapes and/or sizes of the openings of the lid 112 are substantially the same, as shown in FIG. 2. However, embodiments of the disclosure are not limited thereto. Many variations and/or modifications can be made to embodiments of the disclosure. In some other embodiments, shapes and/or sizes of some openings of the lid 112 are different from those of other openings of the lid 112.

In some embodiments, the lid 112 is partially removed to form the openings 115a-115d. The openings 115a-115d may be formed using a laser cutting process, a mechanical cutting process, an etching process, another applicable process, or a combination thereof. In some embodiments, the openings 115a-115d are formed before the lid 112 is bonded with the semiconductor die 102 and the substrate 100. However, embodiments of the disclosure are not limited thereto. Many variations and/or modifications can be made to embodiments of the disclosure. In some other embodiments, the openings 115a-115d are formed after the lid 112 is bonded with the semiconductor die 102 and the substrate 100.

As shown in FIGS. 1B, 2, and 3, the support structures 113a-113d are positioned on corner portions of the substrate 100, in accordance with some embodiments. In some embodiments, the substrate 100 has four corner portions, as shown in FIGS. 2 and 3. The support structures 113a-113d are on the four corner portions of the substrate 100.

However, embodiments of the disclosure are not limited thereto. Many variations and/or modifications can be made to embodiments of the disclosure. In some embodiments, the lid 112 has more than four support structures. In some other embodiments, the lid has less than four support structures. In some other embodiments, some of the support structures are positioned on portions of the substrate 100 that are other than the corner portions. In some other embodiments, some of the corner portions of the substrate 100 are not covered by the support structures.

As shown in FIG. 3, the substrate 100 has a length $L_1$ and a length $L_2$. The lid 112 has a length $L_3$ and a length $L_4$. In some embodiments, the length $L_1$ is greater than the length $L_3$, and the length $L_2$ is greater than the length $L_4$. In some embodiments, the difference between the length $L_1$ and the length $L_3$ is in a range from about 0.5 mm to about 1 mm. For example, the difference between the length $L_1$ and the length $L_3$ is about 0.7 mm. In some embodiments, the difference between the length $L_2$ and the length $L_4$ is in a range from about 0.5 mm to about 1 mm. For example, the difference between the length $L_2$ and the length $L_4$ is about 0.7 mm.

As shown in FIG. 3, each of the support structures 113a-113d has lengths $L_5$ and $L_6$. The length $L_5$ may be about 0.25 times the length $L_3$. The length $L_6$ may be about 0.25 times the length $L_4$. As shown in FIG. 3, the upper plate 111t has lengths $L_7$ and $L_8$. The length $L_7$ may be about 0.8 times the length $L_3$. The length $L_8$ may be about 0.8 times the length $L_4$.

Afterwards, a number of conductive bumps 114 are formed on a surface of the substrate opposite to the surface where the semiconductor die 102 and the lid 112 are disposed, as shown in FIG. 1C in accordance with some embodiments. In some embodiments, the conductive bumps 114 include solder bumps, metal bumps, other suitable structures, or a combination thereof. The conductive bumps 114 may include a combination of a solder material and a metal pillar. In some embodiments, one or more of the conductive bumps 114 are electrically connected to the device elements of the semiconductor die 102 through some of the conductive features formed in the substrate 100 and some of the conductive elements 104.

In some embodiments, one or more semiconductor dies 116 are mounted on the opposite surface of the substrate 100, as shown in FIG. 1C. In some embodiments, conductive elements 118 and a protection layer 120 are formed between the substrate 100 and one of the semiconductor dies 116. The material and formation method of the conductive elements 118 and the protection layer 120 may be similar to those of the conductive elements 104 and the protection layer 106. In some embodiments, some device elements in the semiconductor dies 116 and 102 are electrically connected to each other.

During the formation of the chip package, some processes are performed at a high temperature. For example, the formation of the conductive elements 104 and 118 and the conductive bumps 114 involves high temperature processes, such as reflow processes. Due to the coefficient of thermal expansion (CTE) mismatch between different elements (such as between the thermal interface element 108 and the lid 112), a warpage of the chip package might occur. In some embodiments, due to the lid 112, the warpage of the chip package is kept at an acceptable amount.

In some embodiments, due to the openings 115a-115d, the thermal stress between the substrate 100 and the lid 112 may be released. Delamination between the support structures 113a-113d and the substrate 100 or between the upper plate 111t and the semiconductor die 102 is prevented. The warpage of the chip package is also significantly reduced. In some embodiments, an average warpage of the chip package is reduced to be lower than about 43 μm. In some other cases, the lid 112 does not have support structures or does not have openings. The average warpage of the chip package may be greater than about 59 μm or even greater than about 81 μm.

Embodiments of the disclosure form a lid over a substrate to protect a semiconductor die between the lid and the substrate. The lid is bonded with or secured to the semiconductor die and the substrate and functions as a stiffener and/or a heat sink. The lid has one or more openings formed between an upper plate of lid and the substrate. The openings may reduce thermal stress between the lid and the substrate. Delamination and warpage of the chip package are significantly reduced. Therefore, the reliability and performance of the chip package are improved.

In accordance with some embodiments, a chip package is provided. The chip package includes a substrate and a semiconductor die over a surface of the substrate. The chip package also includes a lid over the semiconductor die. The lid has a number of support structures bonded with the substrate, and the lid has one or more openings between two of the support structures.

In accordance with some embodiments, a chip package is provided. The chip package includes a substrate and a semiconductor die over the substrate. The chip package also includes a lid secured to the semiconductor die and the substrate. The lid has an opening penetrating through the lid.

In accordance with some embodiments, a chip package is provided. The chip package includes a substrate and a semiconductor die mounted on the substrate. The chip package also includes a metal lid having an upper plate and a number of support structures. The upper plate is bonded with the semiconductor die, and the support structures are bonded with the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
a substrate;
a semiconductor die over an upper surface of the substrate; and
a lid over the semiconductor die, wherein the lid has a plurality of support structures bonded with the substrate, the support structures are positioned on corner portions of the substrate, at least one opening is between two of the support structures, the at least one opening penetrates through the lid to expose a space containing the semiconductor die, and an entirety of a top surface of the semiconductor die is covered by the lid.

2. The chip package as claimed in claim 1, further comprising a thermal interface element between the lid and the semiconductor die.

3. The chip package as claimed in claim 2, wherein the thermal interface element is in direct contact with the lid and the semiconductor die.

4. The chip package as claimed in claim 2, further comprising an adhesive element between the substrate and one of the support structures of the lid.

5. The chip package as claimed in claim 4, wherein materials of the thermal interface element and the adhesive element are the same.

6. The chip package as claimed in claim 1, wherein the opening exposes the substrate.

7. The chip package as claimed in claim 1, wherein the lid is made of a metal material.

8. The chip package as claimed in claim 1, further comprising a plurality of conductive bumps disposed on a lower surface of the substrate opposite to the upper surface of the substrate.

9. The chip package as claimed in claim 1, wherein the support structures are on four corner portions of the substrate.

10. A chip package, comprising:
a substrate;
a semiconductor die over the substrate; and
a lid secured to the semiconductor die and the substrate, wherein the lid has a plurality of support structures secured to the substrate, the support structures are positioned on corner portions of the substrate, an opening penetrates through the lid to expose a space containing the semiconductor die, and an entirety of a top surface of the semiconductor die is covered by the lid.

11. The chip package as claimed in claim 10, wherein the lid is secured to the semiconductor die through a thermal interface element, and the lid is secured to the substrate through an adhesive element.

12. The chip package as claimed in claim 11, wherein materials of the thermal interface element and the adhesive element are different from each other.

13. The chip package as claimed in claim 10, wherein at least one of the support structures has a slanted sidewall connecting an upper plate of the lid.

14. The chip package as claimed in claim 13, wherein the opening is surrounded by an edge of the upper plate of the lid and an edge of the slanted sidewall.

15. A chip package, comprising:
a substrate;
a semiconductor die mounted on the substrate; and
a metal lid having an upper plate and a plurality of support structures, wherein the upper plate is bonded with the semiconductor die, the support structures are bonded with the substrate, the support structures are positioned on corner portions of the substrate, an opening is between two of the support structures, the opening penetrates through the metal lid to expose a space containing the semiconductor die, and the upper plate of the metal lid completely covers a top surface of the semiconductor die.

16. The chip package as claimed in claim 15, wherein the metal lid has a single-layered structure.

17. The chip package as claimed in claim 15, wherein the upper plate of the metal lid extends beyond edges of the semiconductor die.

18. The chip package as claimed in claim 14, wherein the edge of the upper plate has a portion surrounding the opening, and the portion of the edge of the upper plate is longer than each of the support structures.

19. The chip package as claimed in claim 15, wherein the upper plate has a first length measured along a direction parallel to an extending direction of an edge of the substrate, the metal lid has a second length measured along the direction, and the second length is greater than the first length.

20. The chip package as claimed in claim 15, wherein one of the support structures has a bonding portion bonded with the substrate, and the bonding portion is not directly below the upper plate.

\* \* \* \* \*